US009059172B2

(12) United States Patent
Su et al.

(10) Patent No.: US 9,059,172 B2
(45) Date of Patent: Jun. 16, 2015

(54) FUSE CIRCUIT

(71) Applicant: Nuvoton Technology Corporation

(72) Inventors: Tuan-Kai Su, Hsinchu (TW); Yao-Feng Huang, Hsinchu (TW); Po-An Chen, Hsinchu (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 0 days.

(21) Appl. No.: 14/284,372

(22) Filed: May 21, 2014

(65) Prior Publication Data

US 2015/0116028 A1    Apr. 30, 2015

(30) Foreign Application Priority Data

Oct. 25, 2013 (TW) .............................. 102138693 A

(51) Int. Cl.
*H01H 37/76*       (2006.01)
*H01L 23/525*      (2006.01)
*G11C 17/16*       (2006.01)

(52) U.S. Cl.
CPC ............ *H01L 23/5256* (2013.01); *G11C 17/16* (2013.01)

(58) Field of Classification Search
USPC .................. 327/427, 524–526; 365/96, 225.7
See application file for complete search history.

(56) References Cited

U.S. PATENT DOCUMENTS

| 4,517,583 | A | 5/1985 | Uchida |
| 5,712,588 | A | 1/1998 | Choi et al. |
| 7,271,644 | B2 | 9/2007 | Lin et al. |
| 7,332,791 | B2 | 2/2008 | Wu |
| 7,432,755 | B1 * | 10/2008 | Park et al. ...................... 327/525 |
| 8,384,466 | B2 * | 2/2013 | Kawasaki et al. ............. 327/525 |
| 2006/0158920 | A1 * | 7/2006 | Sumi et al. ...................... 365/96 |
| 2009/0213678 | A1 | 8/2009 | Luich et al. |
| 2012/0044739 | A1 | 2/2012 | Chung |

* cited by examiner

*Primary Examiner* — Long Nguyen
(74) *Attorney, Agent, or Firm* — McClure, Qualey & Rodack, LLP

(57) ABSTRACT

A fuse circuit includes a plurality of fuses, a plurality of switches and a plurality of trimming components. The fuses are coupled in parallel to a first node and a second node. The first node is coupled to an operating voltage. The switches are coupled to the second node. The trimming components are respectively disposed between the switches and a ground voltage, and coupled to the second node via the switches, respectively. When one of the trimming components is activated, the activated trimming component allows a plurality of branch currents to be generated between the first node and the second node. The branch currents respectively flow through the fuses so that one of the fuses is blown out by the branch current flowing through the one of the fuses.

14 Claims, 8 Drawing Sheets

FUSE CIRCUIT

RELATED APPLICATIONS

This application claims priority to Taiwanese Application Serial Number 102138693, filed Oct. 25, 2013, which is herein incorporated by reference.

BACKGROUND

1. Field of Invention

The present invention relates to a fuse circuit. More particularly, the present invention relates to a fuse circuit having a multi-state resistance value.

2. Description of Related Art

In recent years, the fuse circuit has been widely used in memory devices to serve as a one time programming (OTP) memory unit. When the current flowing through the fuse has a current value greater than the critical value, the fuse blows and the resistance value of the fuse is increased. Therefore, the original resistance value of the fuse and the increased resistance value of the fuse respectively represent two logic states, for example, the low resistance state and the high resistance state respectively represent a logic 0 state and a logic 1 state.

However, when the traditional fuse circuit is programmed, the fuse cannot be re-written once it is written (is blown out). Hence, multiple time programming cannot be performed and a multi-state resistance value is not obtained.

SUMMARY

In accordance with an embodiment, the fuse circuit includes a plurality of fuses, a plurality of switches, and a plurality of trimming components. The plurality of fuses are coupled in parallel to a first node and a second node. The first node is coupled to an operating voltage. The plurality of switches are coupled to the second node. The plurality of trimming components are respectively disposed between the switches and a ground voltage, and are coupled to the second node via the switches respectively. When one of the trimming components is activated, the activated trimming component allows a plurality of branch currents to be generated between the first node and the second node. The branch currents respectively flow through the fuses so that one of the fuses is blown out by the branch current flowing through the one of the fuses.

In accordance with another embodiment, the fuse circuit includes a plurality of fuses, a plurality of switches, a plurality of trimming components, a control circuit and a switch control circuit. The plurality of fuses are coupled in parallel to a first node and a second node. The first node is coupled to an operating voltage. The plurality of switches are coupled to the second node. The plurality of trimming components are respectively disposed between the switches and a ground voltage and coupled to the second node via the switches respectively. The control circuit is configured for generating a first control signal and a second control signal to trigger the trimming components. The switch control circuit is configured for selectively controlling the switches. When one of the trimming components is activated, the activated trimming component allows a plurality of branch currents to be generated between the first node and the second node. The branch currents respectively flow through the fuses so that one of the fuses is blown out by the branch current flowing through the one of the fuses.

In accordance with still another embodiment, the fuse circuit includes a plurality of fuses, a low-voltage triggering silicon control rectifier and a control circuit. The plurality of fuses are coupled in parallel to a first node and a second node. The first node is coupled to an operating voltage. The low-voltage triggering silicon control rectifier is coupled to the second node. The control circuit is configured for generating a first control signal and a second control signal to trigger the low-voltage triggering silicon control rectifier. When the low-voltage triggering silicon control rectifier is activated, the low-voltage triggering silicon control rectifier allows a plurality of branch currents to be generated between the first node and the second node. The branch currents respectively flow through the fuses so that one of the fuses is blown out by the branch current flowing through the one of the fuses.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Various embodiments are described below to explain this invention. However, these embodiments are not intended to limit the application or methods of the present invention in any specific context. Therefore, descriptions of the embodiments are only intended to illustrate rather than to limit the present invention. It should be noted that, in the following embodiments and attached drawings, elements not directly related to this invention are omitted from depiction, and the dimensional relationships depicted among various elements are only for purposes of illustration, rather than limiting the practical implementation of these elements.

As used herein, "couple" refers to direct physical contact or electrical contact or indirect physical contact or electrical contact between two or more components. Or it can also refer to reciprocal operations or actions between two or more components.

Figure 1A:
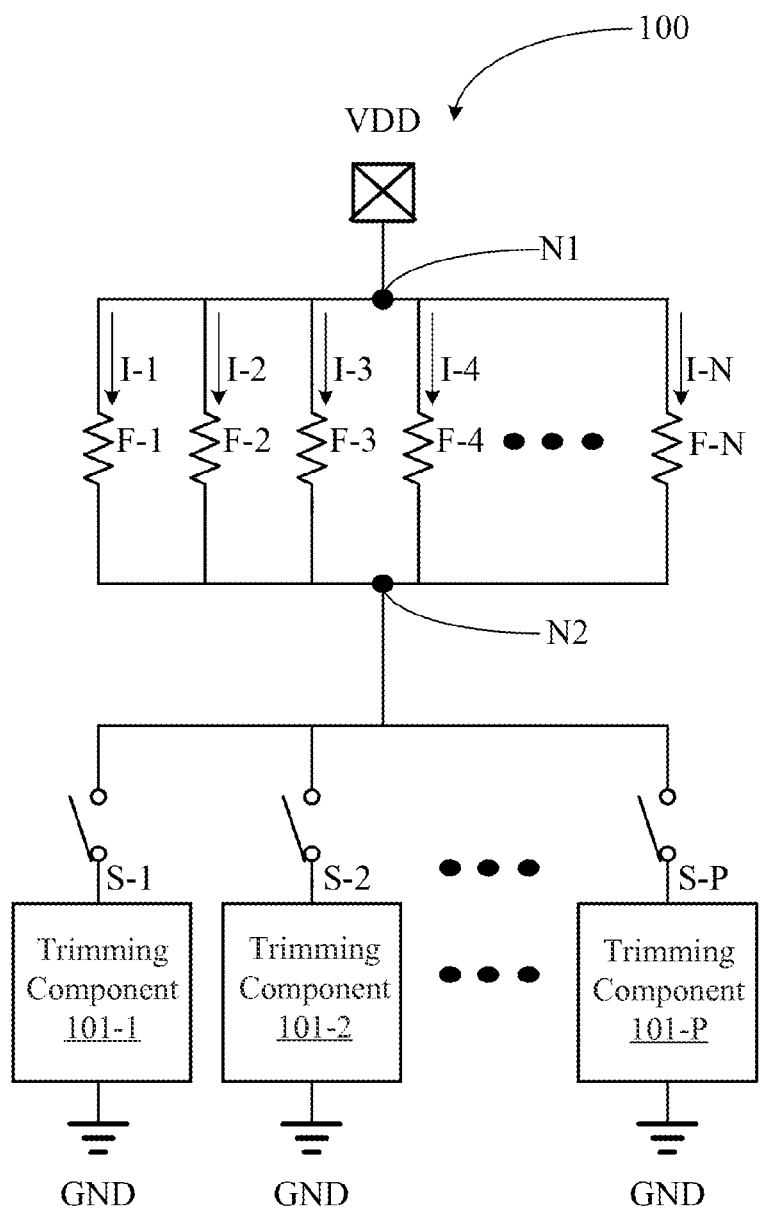
FIG. 1A depicts a schematic diagram of a fuse circuit according to one embodiment of this invention.

FIG. 1A depicts a schematic diagram of a fuse circuit 100 according to one embodiment of this invention. The fuse circuit 100 includes a plurality of fuses F-1~F-N (N is an integer greater than one), a plurality of switches S-1~S-P (P is an integer greater than one), and a plurality of trimming components 101-1~101-P. It is noted that the number of the switches S-1~S-P corresponds to the number of the trimming components 101-1~101-P. In other words, the number of the switches S-1~S-P is the same as the number of the trimming components 101-1~101-P.

In the present embodiment, the fuses F-1~F-N may be one time programmable fuses, and the fuses F-1~F-N may have different resistance values.

In another embodiment, at least two of the fuses F-1~F-N have different resistance values. For example, the resistance value of the fuse F-1 is different from the resistance value of the fuses F-2~F-N, and the fuses F-2~F-N have the same resistance value. In another example, the resistance value of the fuse F-1 is different from the resistance value of the fuse F-2, the other fuses F-3~F-N have the same resistance value, and the resistance value of the fuse F-3 is different from the resistance value of the fuse F-1 and the resistance value of the fuse F-2.

In still another embodiment, each of the fuses F-1~F-N may include polysilicon, metal, or a metal via. Each of the fuses F-1~F-N may also be made of another material that may be used for fabricating the fuses F-1~F-N or in another structure. The resistance value R of a fuse can be obtained by calculating resistivity $\rho_1$, length L, and cross sectional area A. The formula for calculating resistance value R is as follows:

$$R=\rho_1 *L/A$$

When the cross sectional area A and the length L are not changed, the resistance value R only correlates with the resistivity. Under the circumstances, the resistance values of the fuses fabricated from different materials are very different. In one embodiment, the multiple relationships between the resistance values of the fuses fabricated from different materials may range from 10 times to 1000 times.

In yet another embodiment, the multiple relationships between the resistance values of the fuses F-1~F-N may range from 10 times to 1000 times. For example, the resistance value of the fuse F-1 may be 0.1 ohm, the resistance value of the fuse F-2 may be 10 ohms, and the resistance value of fuse F-1 and the resistance value of the fuse F-2 are different from the resistance values of the other fuses F-3~F-N.

In another embodiment, the multiple relationship between the resistance values of two of the fuses F-1~F-N may range from 10 times to 1000 times. For example, the resistance value of the fuse F-1 may be 10 ohms, and the fuses F-2~F-N have the same resistance value of 100 ohms. In another example, the resistance values of the fuse F-1 and the fuse F-2 are respectively 1 ohm and 100 ohms (which are different from each other), and the other fuses F-3~F-N have the same resistance value of 1000 ohms. It is noted that the above resistance values are only for explanation of aspects of the present embodiment and are not intended to limit the present invention.

In the present embodiment, the fuses F-1~F-N are coupled in parallel to a first node N1 and a second node N2. The first node N1 is coupled to an operating voltage VDD. In addition, the switches S-1~S-P are coupled to the second node N2. The trimming components 101-1~101-P are respectively disposed between the switches S-1~S-P and a ground voltage GND. Also, the trimming components 101-1~101-P are respectively coupled to the second node N2 via the switches S-1~S-P, respectively.

With respect to the operations, when one of the trimming components 101-1~101-P is activated, the activated trimming component allows a plurality of branch currents I-1~I-N to be generated between the first node N1 and the second node N2. The branch currents I-1~I-N respectively flow through the fuses F-1~F-N so that one of the fuses F-1~F-N is blown out by the branch current flowing through the one of the fuses F-1~F-N. In greater detail, when the branch currents I-1~I-N flow through fuses F-1~F-N respectively, the fuse having the smallest resistance value among the fuses F-1~F-N will correspond to the branch current having the greatest current value, the fuse having the smallest resistance value among the fuses F-1~F-N is thus blown out because the corresponding branch current having the greatest current value exceeds a critical value tolerable for the fuse having the smallest resistance value. It is noted that the number of the branch currents I-1~I-N corresponds to the number of the fuses F-1~F-N. In other words, the number of the branch currents I-1~I-N is the same as the number of the fuses F-1~F-N.

Figure 1B:
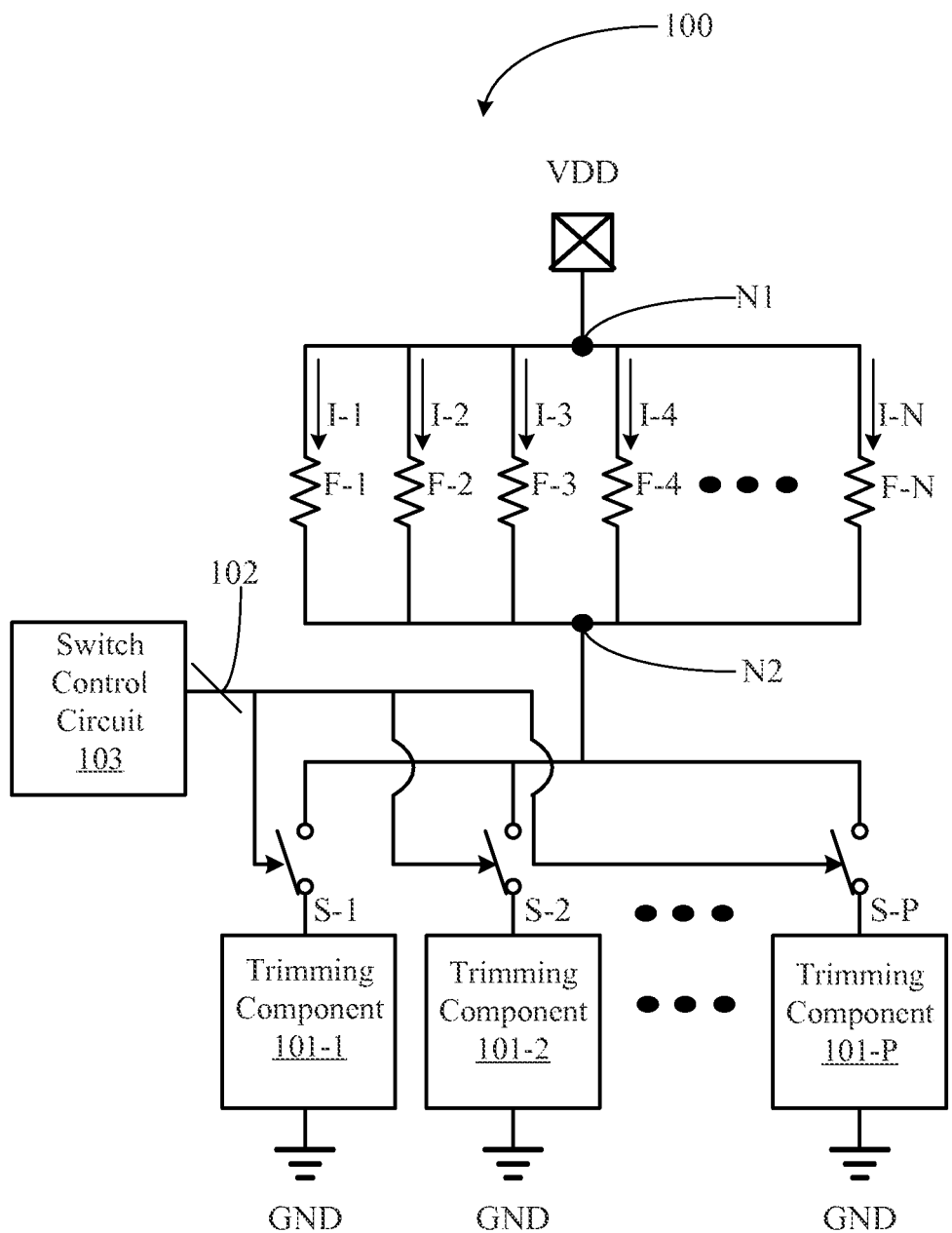
FIG. 1B depicts a schematic diagram of a fuse circuit according to another embodiment of this invention.

In another embodiment, as shown in FIG. 1B, the fuse circuit 100 may further include a switch control circuit 103. The switch control circuit 103 is configured for selectively controlling the switches S-1~S-P to allow one of the trimming components 101-1~101-P to be conducted with the fuses F-1~F-N. In greater detail, the switch control circuit 103 transmits a switch control signal 102 to the switches S-1~S-P to allow one of the switches S-1~S-P to receive the switch control signal 102 and allow one of the trimming components 101-1~101-P to be conducted with the fuses F-1~F-N according to the switch control signal 102. When one of the trimming components 101-1~101-P is conducted to the fuses F-1~F-N, the conducted trimming component allows the branch currents I-1~I-N to be generated between the first node N1 and the second node N2, and the branch currents I-1~I-N respectively flow through fuses F-1~F-N to trim the fuses F-1~F-N.

Figure 2:
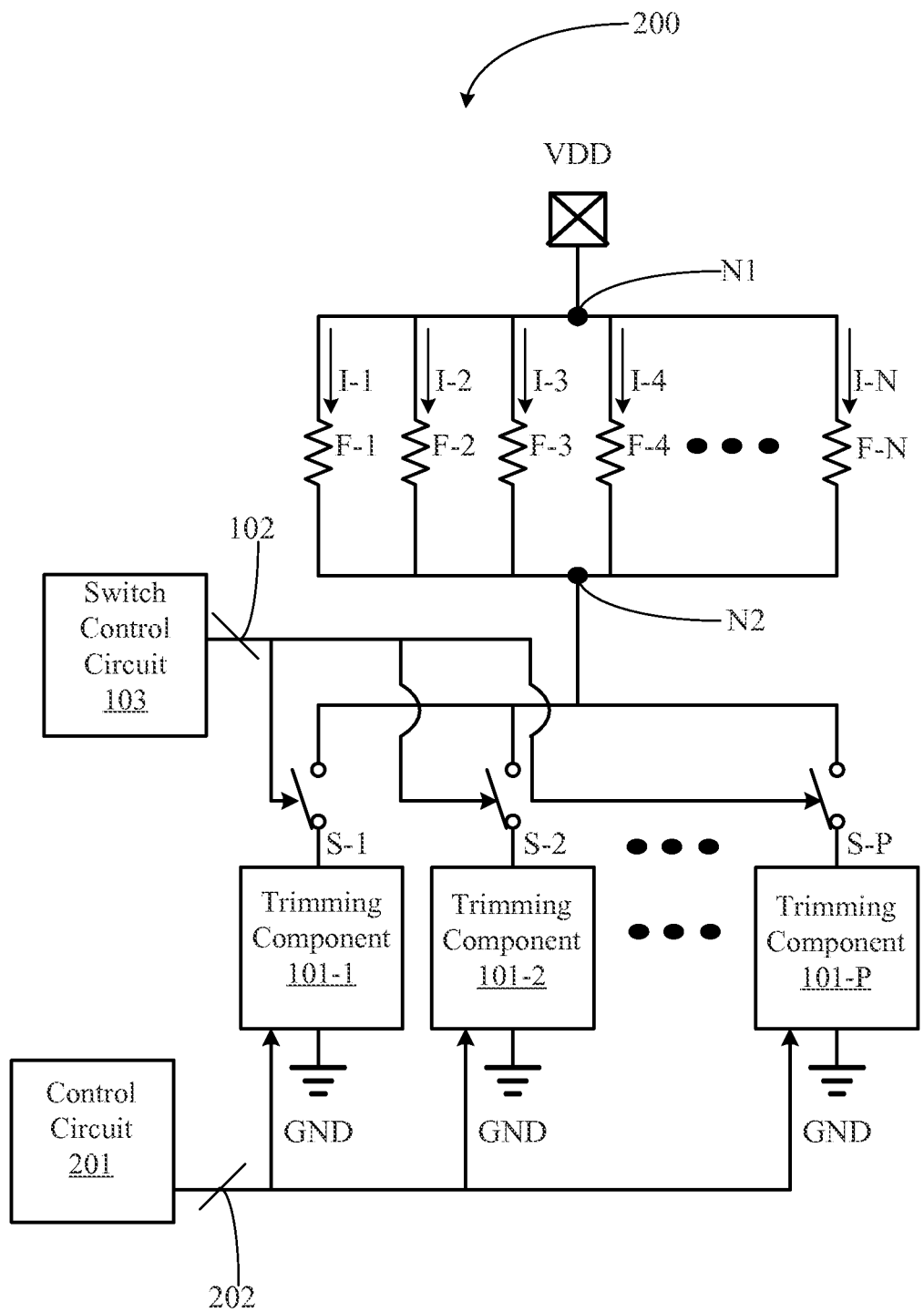
FIG. 2 depicts a schematic diagram of a fuse circuit according to still another embodiment of this invention.

FIG. 2 depicts a schematic diagram of a fuse circuit 200 according to still another embodiment of this invention. Since the fuse circuit 200 of the present embodiment is similar to the fuse circuit 100, only the difference between the fuse circuit 200 and the fuse circuit 100 is described as follows.

As shown in FIG. 2, the fuse circuit 200 further includes a control circuit 201 configured for generating a control signal 202 to trigger the trimming components 101-1~101-P.

For example, each of the trimming components 101-1~101-P includes a silicon control rectifier (SCR), a metal oxide semiconductor (MOS) device, a low-voltage triggering silicon control rectifier (LVTSCR), or a trimming circuit. When the trimming component is a silicon control rectifier, only a short pulse signal is required to achieve triggering, e.g., 1000 nanoseconds. When a metal oxide semiconductor device is used as the trimming component, a pulse signal having a longer duration is required to turn on the metal oxide semiconductor device, e.g., 10 microseconds. It is noted that the above trimming components are only for explanation of aspects of the present embodiment and are not intended to limit the present invention. Any component capable of trimming the fuse is within the scope of the present invention.

Additionally, a proper component can be selected to serve as the trimming components 101-1~101-P depending on circuit designs according to the present invention. The control circuit 201 transmits the control signal 202 to the trimming components 101-1~101-P to trigger the trimming components 101-1~101-P so as to generate the branch currents I-1~I-N. The fuses F-1~F-N are thus trimmed. In practical applications, the switch control circuit 103 and the control circuit 201 can generate signals synchronously. In other words, when one of the switches S-1~S-P is turned on, the trimming component corresponding to the one of the switches S-1~S-P is triggered at the same time point.

In another practical application, the switch control circuit 103 and the control circuit 201 can generate signals asynchronously. In other words, once one of the switches S-1~S-P is turned on, the trimming component corresponding to the one of the switches S-1~S-P is triggered at a delayed time point.

Figure 3A:
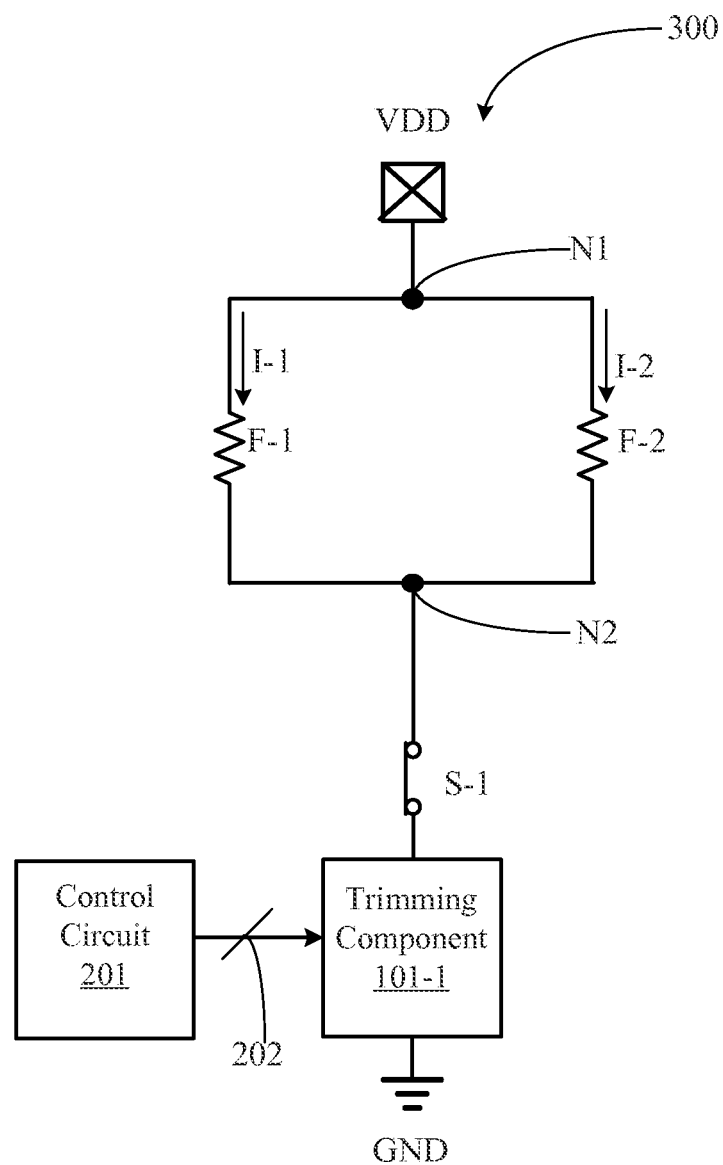
FIG. 3A depicts a schematic diagram of a fuse circuit according to yet another embodiment of this invention.

FIG. 3A depicts a schematic diagram of a fuse circuit 300 according to yet another embodiment of this invention. Since the fuse circuit 300 of the present embodiment is similar to the fuse circuit 200, and the fuse circuits 200 and 300 include the same components, a description in this regard is not provided.

To simplify the matters, the number N here is set to two. That is, the fuse circuit 300 includes the fuse F-1 and the fuse F-2, in which the fuse F-1 is set to be a metal fuse and the fuse F-2 is set to be a polysilicon fuse. It is noted that the above-mentioned numbers and materials of the fuses are only for explanation of aspects of the present embodiment and are not intended to limit the present invention.

As shown in FIG. 3A, the switch S-1 is set to be turned on to allow the trimming component 101-1 to be coupled to the fuse F-1 and the fuse F-2. In the present embodiment, the trimming component 101-1 is set to be a low-voltage triggering silicon control rectifier that includes a silicon control rectifier and a metal oxide semiconductor device. It is noted that since the switch S-1 is in a conducting state and the other switches S-2~S-P are in a non-conducting state, in FIG. 3A only the conducting state of the switch S-1 is depicted and the non-conducting state of the other switches S-2~S-P is not depicted.

To simplify the matters, a description is provided as follows by taking the fuse F-1 to be a metal fuse and the fuse F-2 to be a polysilicon fuse as an example. When the fuse F-1 is a metal fuse and the fuse F-2 is a polysilicon fuse, the resistance value of the fuse F-1 is approximately 0.1 ohm and the resistance value of the fuse F-2 is approximately 100 ohms.

With respect to the operations, in a first state, the control circuit 201 does not generate the control signal 202 and the trimming component 101-1 does not act. At this time, the fuse F-1 (such as the metal fuse) and the fuse F-2 (such as the polysilicon fuse) are coupled in parallel to the first node N1 and the second node N2. A total resistance value of the metal fuse and the polysilicon fuse is approximately 0.1 ohm.

Figure 3B:
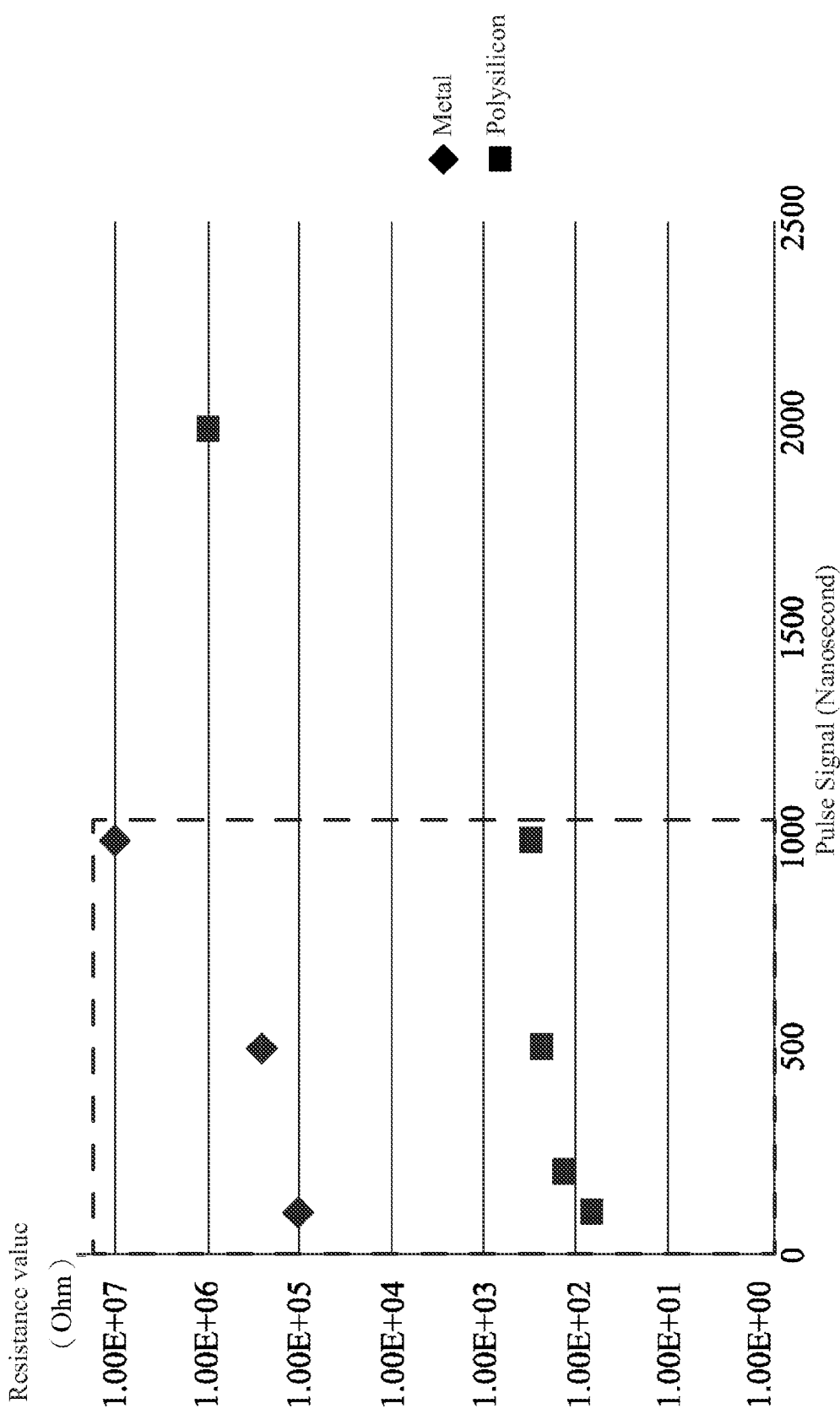
FIG. 3B is a schematic diagram showing relationships between resistance values of a fuse circuit and a pulse signal according to one embodiment of this invention.

In a second state, the control circuit 201 generates the control signal 202. The control signal 202 includes a pulse signal. The control circuit 201 activates the silicon control rectifier by transmitting a pulse signal having a short duration to trigger the silicon control rectifier in the low-voltage triggering silicon control rectifier. In the present embodiment, the metal fuse has a smaller resistance value when compared with the polysilicon fuse. Hence, the branch current I-2 flowing through the polysilicon fuse has a smaller current value and the branch current I-1 flowing through the metal fuse has a greater current value. Under the circumstances, the branch current I-1 flowing through the metal fuse has the current value exceeding a critical value tolerable by the metal fuse, the metal fuse is thus blown out and generates a new resistance value. FIG. 3B is a schematic diagram showing relationships between fuse resistance values and a pulse signal. When the fuses F-1 and F-2 are trimmed the first time, the pulse signal transmitted has a duration of approximately 100 nanoseconds. The resistance value of the metal fuse increases to approximately 100K ohms and the resistance value of the polysilicon fuse is still approximately 100 ohms. Under the circumstances, a new total resistance value of the metal fuse and the polysilicon fuse is approximately 100 ohms.

In a third state, the control circuit 201 re-generates the control signal 202 so that the trimming component 101-1 is re-activated. The control signal 202 generated by the control circuit 201 is a pulse signal having a longer duration so as to trigger the metal oxide semiconductor device in the low-voltage triggering silicon control rectifier. The metal oxide semiconductor device is thus activated. For example, in the embodiment shown in FIG. 3B, the control circuit 201 uses the pulse signal having the duration of 2000 nanoseconds to trigger the metal oxide semiconductor device in the low-voltage triggering silicon control rectifier. According to the present embodiment, the new resistance value of the metal fuse is greater than the resistance value of the polysilicon fuse, the branch current I-1 flowing through the metal fuse thus has a current value smaller than that of the branch current I-2 flowing through the polysilicon fuse. In practical applications, the branch current I-2 flowing through the polysilicon fuse has the current value exceeding a critical value tolerable by the polysilicon fuse, the polysilicon fuse is thus blown out and generates a new resistance value which is approximately 1M ohms. Under the circumstances, a new total resistance value of the metal fuse and the polysilicon fuse is approximately 100K ohms because the resistance value of the metal fuse is 100K ohms and the new resistance value of the polysilicon fuse is 1M ohms. In this manner, the total resistance values in the first state, the second state, and the third state are respectively 0.1 ohm, 100 ohms, and 100K ohms, and the multiple relationships between the resistance values in the first and second states and in the second and third states are approximately 1000 times.

Figure 3C:
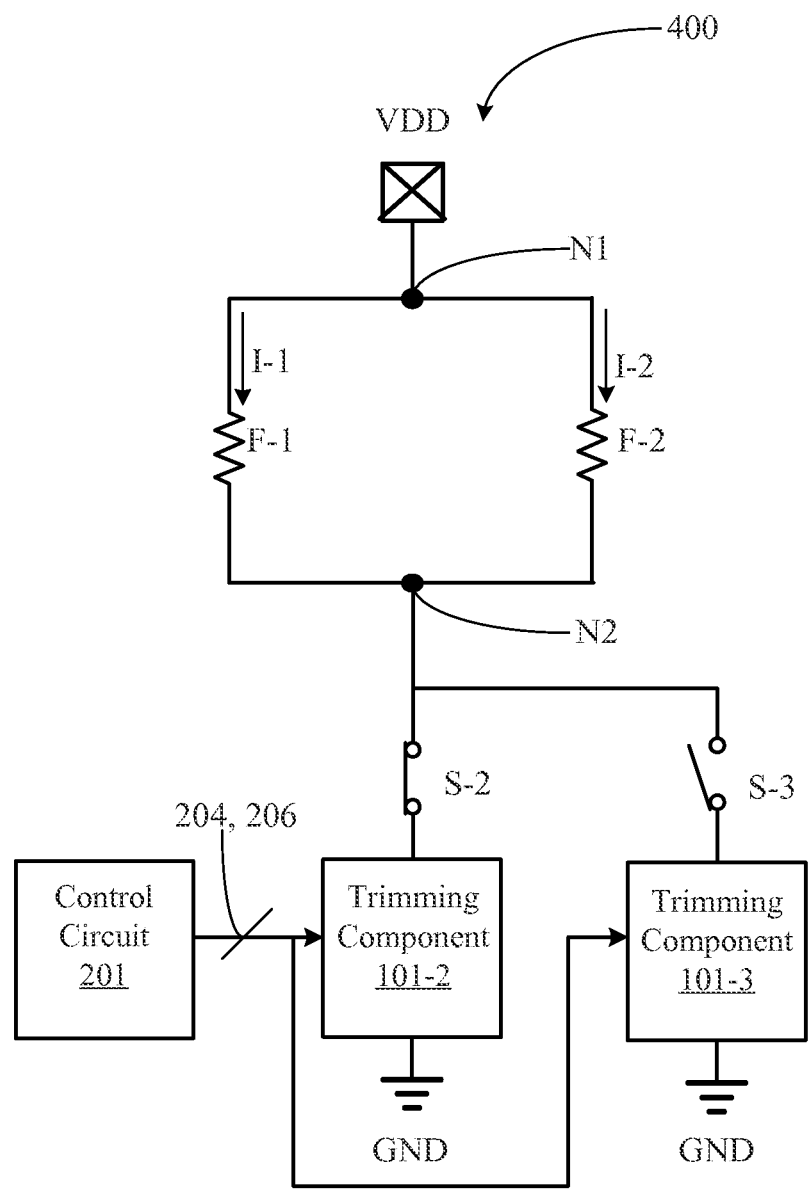
FIG. 3C depicts a schematic diagram of a fuse circuit according to another embodiment of this invention.

FIG. 3C depicts a schematic diagram of a fuse circuit 400 according to another embodiment of this invention. Since the fuse circuit 400 of the present embodiment is similar to the fuse circuit 300 and part of the components in the fuse circuits 300, 400 are the same, a description in this regard is not provided.

Different from FIG. 3A, only the trimming component 101-2, the trimming component 101-3, and the switch S-2 and the switch S-3 corresponding to the trimming component 101-2 and the trimming component 101-3 are depicted in FIG. 3C, other switches and trimming components are not depicted. In the present embodiment, the trimming component 101-2 is set to be a silicon control rectifier. The trimming component 101-3 is set to be a metal oxide semiconductor device.

With respect to the operations in FIG. 3C, first, the switch S-2 is set to be turned on so that the trimming component 101-2 is coupled to the fuse F-1 and the fuse F-2.

To simplify the matters, a description is provided as follows by taking the fuse F-1 to be a metal fuse and the fuse F-2 to be a polysilicon fuse for example. When the fuse F-1 is a metal fuse and the fuse F-2 is a polysilicon fuse, the resistance value of the fuse F-1 is approximately 0.1 ohm and the resistance value of the fuse F-2 is approximately 100 ohms.

With respect to the operations, in a first state, the control circuit 201 does not generate a control signal 204 and 206, so that the trimming component 101-2 does not act. At this time, the fuse F-1 (such as the metal fuse) and the fuse F-2 (such as the polysilicon fuse) are coupled in parallel to the first node N1 and the second node N2. A total resistance value of the metal fuse and the polysilicon fuse is approximately 0.1 ohm.

In a second state, the control circuit 201 generates the control signal 204 at a first time. The control signal 204 includes a pulse signal. The control circuit 201 triggers the silicon control rectifier by transmitting a pulse signal having a short duration so that the silicon control rectifier is activated. In the present embodiment, the metal fuse has a smaller resistance value when compared with the polysilicon fuse. Hence, the branch current I-2 flowing through the polysilicon fuse has a smaller current value and the branch current I-1 flowing through the metal fuse has a greater current value. Under the circumstances, the branch current I-1 flowing through the metal fuse has the current value exceeding a critical value tolerable by the metal fuse, the metal fuse is thus blown out and generates a new resistance value. The relationships between the fuse resistance values and the pulse signal is shown in FIG. 3B. When the fuses F-1 and F-2 are trimmed the first time, the pulse signal transmitted has a duration of approximately 100 nanoseconds. The resistance value of the metal fuse increases to approximately 100K ohms and the resistance value of the polysilicon fuse is still approximately 100 ohms. Under the circumstances, a new total resistance value of the metal fuse and the polysilicon fuse is approximately 100 ohms.

After that, the switch S-2 is set not to be turned on and the switch S-3 is set to be turned on by the switch control circuit 103 (not shown in FIG. 3C). Hence, the trimming component 101-3 is coupled to the fuse F-1 and the fuse F-2.

In a third state, the control circuit 201 generates the control signal 206 at a second time so that the trimming component 101-3 is activated. The control signal 206 generated by the control circuit 201 is a pulse signal having a longer duration to trigger the metal oxide semiconductor device so that the metal oxide semiconductor device is activated. In the present embodiment, the new resistance value of the metal fuse is greater than the resistance value of the polysilicon fuse, the branch current I-1 flowing through the metal fuse thus has a current value smaller than that of the branch current I-2 flowing through the polysilicon fuse. In practical applications, the branch current I-2 flowing through the polysilicon fuse has the current value exceeding a critical value tolerable by the polysilicon fuse, the polysilicon fuse is thus blown out and generates a new resistance value that is approximately 1M ohms. Under the circumstances, a new total resistance value of the metal fuse and the polysilicon fuse is approximately 100K ohms because the resistance value of the metal fuse is 100K ohms and the new resistance value of the polysilicon fuse is 1M ohms.

In short, the control circuit 201 generates the control signal 204 at the first time to trigger the silicon control rectifier. Then, after a delay time, the control circuit 201 generates the control signal 206 at the second time to trigger the metal oxide semiconductor device. In other words, the second time is later than the first time. Additionally, the width of the pulse signal that serves as the control signal 204 is greater than the width of the pulse signal that serves as the control signal 206.

In this manner, the total resistance values obtained in the first state, the second state, and the third state are respectively 0.1 ohm, 100 ohms, and 100K ohms according to the above embodiment, and multiple relationships between the resistance values in the first and second states and in the second and third states are approximately 1000 times.

Figure 4:
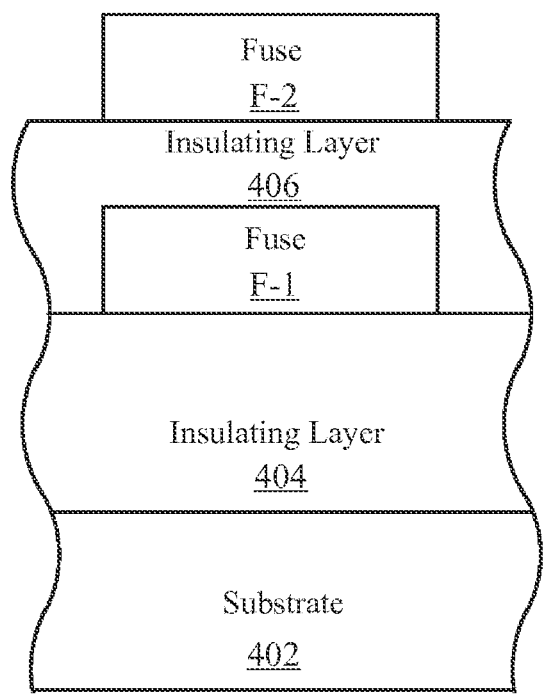
FIG. 4 is a cross-sectional view of a plurality of fuses according to one embodiment of this invention.

In one embodiment, since using different materials to fabricate the fuses F-1~F-P makes the multiple relationships between their resistance values range from 10 times to 1000 times, the fuses F-1~F-P made from different materials are fabricated as different layers on a substrate by deposition. FIG. 4 is a cross-sectional view of a plurality of fuses according to one embodiment of this invention. For example, as shown in FIG. 4, the fuse F-1 and the fuse F-2 are made from different materials. The fuse F-1 and the fuse F-2 are stacked on the substrate 402 in sequence. The fuse F-1 and the fuse F-2 are fabricated as different layers and are isolated by an insulating layer 404 and an insulating layer 406. It is noted that the above-mentioned numbers of the fuses and the insulating layers are only for explanation of aspects of the present embodiment and are not intended to limit the present invention.

Figure 5:
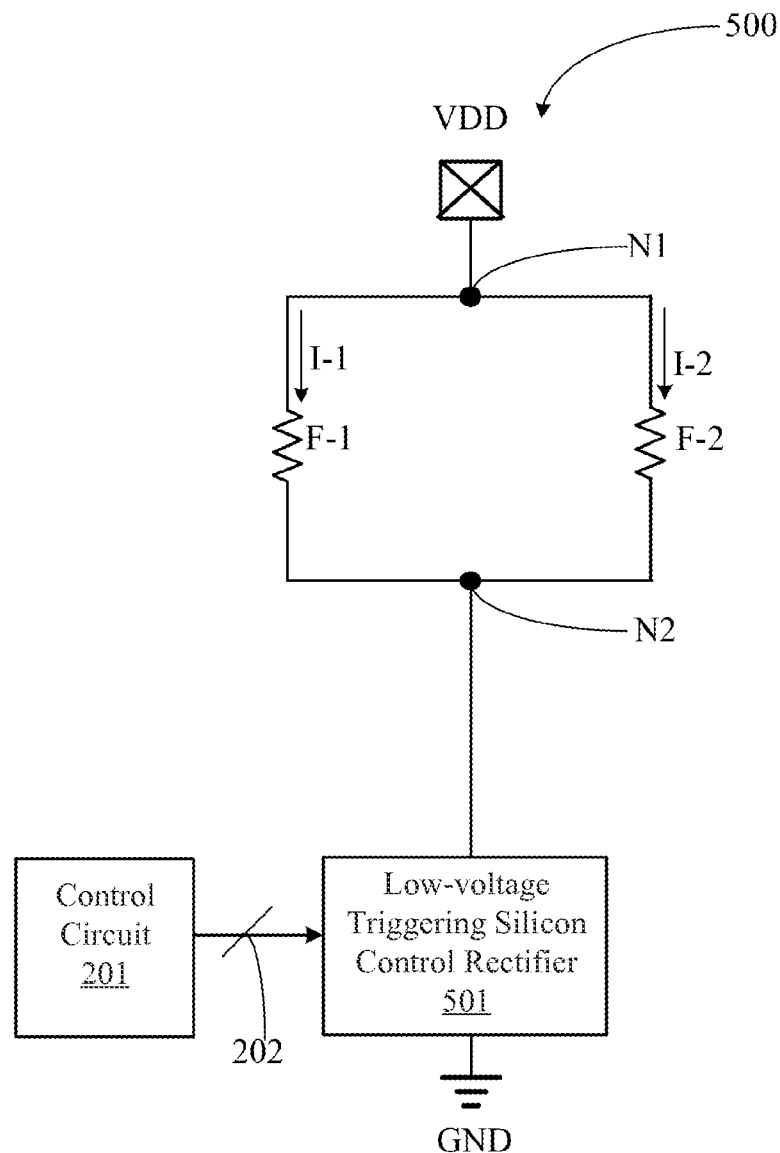
FIG. 5 depicts a schematic diagram of a fuse circuit according to still another embodiment of this invention.

FIG. 5 depicts a schematic diagram of a fuse circuit 500 according to still another embodiment of this invention. Since the fuse circuit 500 of the present embodiment is similar to the fuse circuit 300 and part of the components in the fuse circuits 300 and 500 are the same, only the difference between the fuse circuit 300 and the fuse circuit 500 is described.

As shown in FIG. 5, the difference between the fuse circuit 300 and the fuse circuit 500 lies in that the fuse circuit 500 does not include the switches S-1~S-P and the switch control circuit 103. In greater detail, the fuse circuit 500 includes the fuse F-1, the fuse F-2, the control circuit 201, and a low-voltage triggering silicon control rectifier 501. The low-voltage triggering silicon control rectifier 501 is a trimming component of the fuse circuit 500. To simplify the matters, the fuse F-1 is set to be a metal fuse and the fuse F-2 is set to be a polysilicon fuse. Under the circumstances, the resistance value of the fuse F-1 is approximately 0.1 ohm, and the resistance value of the fuse F-2 is approximately 100 ohms. It is noted that the above-mentioned numbers and materials of the fuses are only for explanation of aspects of the present embodiment and are not intended to limit the present invention.

With respect to the operations, in a first state, the control circuit 201 does not generate the control signal 202 so that the low-voltage triggering silicon control rectifier 501 does not act. In addition, the fuse F-1 (such as the metal fuse) and the fuse F-2 (such as the polysilicon fuse) are coupled in parallel to the first node N1 and the second node N2. A total resistance value of the metal fuse and the polysilicon fuse is approximately 0.1 ohm.

In a second state, the control circuit 201 generates the control signal 202 to trigger the low-voltage triggering silicon control rectifier 501 so that a silicon control rectifier in the low-voltage triggering silicon control rectifier 501 is triggered by a pulse signal that serves as the control signal 202 at a first time. When the fuses F-1 and F-2 are trimmed the first time, the pulse signal transmitted by the control circuit 201 has a duration of approximately 100 nanoseconds. The resistance value of the metal fuse increases to approximately 100K ohms and the resistance value of the polysilicon fuse is still approximately 100 ohms. Under the circumstances, a new total resistance value of the metal fuse and the polysilicon fuse is approximately 100 ohms.

In a third state, the control circuit 201 generates the control signal 202 to trigger the low-voltage triggering silicon control rectifier 501 so that a metal oxide semiconductor device in the low-voltage triggering silicon control rectifier 501 is triggered by a pulse signal that serves as the control signal 202 at a second time. When the fuses F-1 and F-2 are trimmed the second time, the pulse signal transmitted by the control circuit 201 has a duration of approximately 2000 nanoseconds. The resistance value of the polysilicon fuse thus increases to approximately 1M ohms. Under the circumstances, a new total resistance value of the metal fuse and the polysilicon fuse is approximately 100K ohms because the resistance value of the metal fuse is 100K ohms and the new resistance value of the polysilicon fuse is 1M ohms. In this manner, the total resistance values in the first state, the second state, and the third state are respectively 0.1 ohm, 100 ohms, and 100K ohms, and the multiple relationships between the resistance values in the first and second states and in the second and third states are approximately 1000 times.

According to the above embodiments, it is understood that a plurality of fuses and a single trimming component or a plurality of fuses and a plurality of trimming components constitute the fuse circuit in the present invention. A specific trimming component is selected and a proper pulse signal is transmitted to trim the fuses. In addition, the fuses have different resistance values, in which the fuse having the smallest resistance value is blown out by the trimming current generated by the activated trimming component. Hence, two or more than two resistance values can be achieved through multiple time programming.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fuse circuit comprising:
   a plurality of fuses coupled in parallel to a first node and a second node, wherein the first node is coupled to an operating voltage;
   a plurality of switches coupled to the second node; and
   a plurality of trimming components respectively disposed between the switches and a ground voltage, and the trimming components being coupled to the second node via the switches respectively;
   wherein when one of the trimming components is activated, the activated trimming component allows a plurality of branch currents to be generated between the first node and the second node, the branch currents respectively flow through the fuses so that one of the fuses is blown out by the branch current flowing through the one of the fuses.

2. The fuse circuit of claim 1, wherein the fuses have different resistance values.

3. The fuse circuit of claim 1, wherein at least two of the fuses have different resistance values.

4. The fuse circuit of claim 1 further comprising a switch control circuit, wherein the switch control circuit selectively controls the switches so as to activate the one of the trimming components.

5. The fuse circuit of claim 1 further comprising a control circuit, wherein the control circuit is configured for generating a control signal to trigger the trimming components.

6. The fuse circuit of claim 1 further comprising a control circuit, wherein the control circuit is configured for generating a first control signal at a first time and for generating a second control signal at a second time to trigger the trimming components, wherein the pulse width of the second control signal is greater than the pulse width of the first control signal, and the second time is later than the first time.

7. The fuse circuit of claim 1, wherein the multiple relationships between the resistance values of the fuses range from 10 times to 1000 times.

8. The fuse circuit of claim 1, wherein the multiple relationship between the resistance values of two of the fuses ranges from 10 times to 1000 times.

9. A fuse circuit comprising:
   a plurality of fuses coupled in parallel to a first node and a second node, wherein the first node is coupled to an operating voltage;
   a plurality of switches coupled to the second node;
   a plurality of trimming components respectively disposed between the switches and a ground voltage, and the trimming components being coupled to the second node via the switches respectively;
   a control circuit configured for generating a first control signal and a second control signal to trigger the trimming components; and
   a switch control circuit configured for selectively controlling the switches;
   wherein when one of the trimming components is activated, the activated trimming component allows a plurality of branch currents to be generated between the first node and the second node, the branch currents respectively flow through the fuses so that one of the fuses is blown out by the branch current flowing through the one of the fuses.

10. The fuse circuit of claim 9, wherein the fuses have different resistance values.

11. The fuse circuit of claim 9, wherein at least two of the fuses have different resistance values.

12. The fuse circuit of claim 9, wherein the trimming components are triggered by the first control signal at a first time, and are triggered by the second control signal at a second time, the pulse width of the second control signal is greater than the pulse width of the first control signal, and the second time is later than the first time.

13. The fuse circuit of claim 9, wherein the multiple relationships between the resistance values of the fuses range from 10 times to 1000 times.

14. The fuse circuit of claim 9, wherein the multiple relationship between the resistance values of two of the fuses ranges from 10 times to 1000 times.

* * * * *